(12) United States Patent
Zhang et al.

(10) Patent No.: US 12,271,187 B2
(45) Date of Patent: Apr. 8, 2025

(54) PREDICTION OF RESOLVER MALFUNCTIONS

(71) Applicant: GM GLOBAL TECHNOLOGY OPERATIONS LLC, Detroit, MI (US)

(72) Inventors: Jiyu Zhang, Sterling Heights, MI (US); Brian J. Gallert, Lake Orion, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 259 days.

(21) Appl. No.: 17/993,322

(22) Filed: Nov. 23, 2022

(65) Prior Publication Data

US 2024/0168474 A1 May 23, 2024

(51) Int. Cl.
*G05B 23/02* (2006.01)
*G01R 31/34* (2020.01)

(52) U.S. Cl.
CPC ....... *G05B 23/0283* (2013.01); *G01R 31/343* (2013.01); *G05B 23/0275* (2013.01)

(58) Field of Classification Search
CPC ............ G05B 23/0283; G05B 23/0275; G05B 23/0232; G05B 2219/2637; G01R 31/343; G01D 18/00
See application file for complete search history.

(56) References Cited

U.S. PATENT DOCUMENTS

2021/0107501 A1* 4/2021 Monteil ............... A61B 5/6893
2024/0012063 A1* 1/2024 Liu ..................... G01R 31/3835

* cited by examiner

*Primary Examiner* — Yonel Beaulieu
(74) *Attorney, Agent, or Firm* — CANTOR COLBURN LLP (57) ABSTRACT

A method of monitoring a propulsion system of a vehicle includes determining a health indicator from a diagnostic signal based on electrical outputs from a resolver connected to an electric motor of the propulsion system, the diagnostic signal related to a resolver offset and/or a resolver wobble, calculating a reference value based on values of the health indicator determined during a first time period, and monitoring the health indicator over a second time period, where the monitoring includes continuously or periodically calculating a trend value of the health indicator over a plurality of cycles. The method also includes comparing each trend value to the reference value and estimating a difference between the trend value and the reference value for each cycle, predicting whether a fault will occur based on the difference, and based on the predicting indicating that a fault will occur, outputting a fault indication.

20 Claims, 7 Drawing Sheets

PREDICTION OF RESOLVER MALFUNCTIONS

INTRODUCTION

The subject disclosure relates to control of electric motors, and more specifically, to detection, diagnosis and/or prognosis of problems in resolvers used with electric motors.

Electric vehicles (EV) and hybrid electric vehicles (HEV) (i.e., electrified vehicles) may include an electric propulsion system including one or more electric drive units having an electric traction motor. Popular motor control methodologies include field oriented control and direct torque control. Various factors contribute to the range and efficiency of an EV. For example, faults or malfunctions in a resolver or motor position sensor can cause motor imbalance, torque errors and inefficient propulsion.

SUMMARY

In one exemplary embodiment, a method of monitoring a propulsion system of a vehicle includes determining a health indicator from a diagnostic signal acquired from a processing device, the diagnostic signal based on electrical outputs from a resolver connected to an electric motor of the propulsion system, the diagnostic signal related to at least one of a resolver offset and a resolver wobble, calculating a reference value based on values of the health indicator determined during a first time period, and monitoring the health indicator over a second time period, where the monitoring includes continuously or periodically calculating a trend value of the health indicator over a plurality of cycles. The method also includes comparing each trend value to the reference value and estimating a difference between the trend value and the reference value for each cycle, predicting whether a fault will occur based on the difference, and based on the predicting indicating that a fault will occur, outputting a fault indication.

In addition to one or more of the features described herein, the predicting includes comparing the difference to a threshold value, and predicting that the fault will occur based on the difference exceeding the threshold.

In addition to one or more of the features described herein, the predicting includes predicting that the fault will occur based on the difference exceeding the threshold over a number of cycles exceeding a threshold number.

In addition to one or more of the features described herein, the diagnostic signal includes a first voltage response from a first winding of the resolver, and a second voltage response from a second winding of the resolver, the first winding orthogonal to the second winding, and the health indicator is based on a first signal envelope calculated by demodulating the first voltage response, and a second signal envelope calculated by demodulating the second voltage response.

In addition to one or more of the features described herein, the health indicator includes a compensation value acquired based on a wobble compensation algorithm.

In addition to one or more of the features described herein, the health indicator includes a normalized modulus of the first signal envelope and the second signal envelope.

In addition to one or more of the features described herein, the health indicator includes a resolver offset value.

In addition to one or more of the features described herein, calculating the reference value includes calculating a nominal value of a moving average of the health indicator during the first time period, and the trend value is a moving average of the health indicator during the second time period.

In another exemplary embodiment, a device for monitoring a propulsion system of a vehicle includes a processing device connected to a resolver configured to measure a position of an electric motor of the propulsion system. The processing device is configured to determine a health indicator from a diagnostic signal, the diagnostic signal based on electrical outputs from the resolver and related to at least one of a resolver offset and a resolver wobble, and calculate a reference value based on values of the health indicator determined during a first time period. The processing device is also configured to monitor the health indicator over a second time period, the monitoring including continuously or periodically calculating a trend value of the health indicator over a plurality of cycles, compare each trend value to the reference value and estimate a difference between the trend value and the reference value for each cycle, predict whether a fault will occur based on the difference, and based on the predicting indicating that a fault will occur, output a fault indication.

In addition to one or more of the features described herein, the predicting includes comparing the difference to a threshold value, and predicting that the fault will occur based on the difference exceeding the threshold.

In addition to one or more of the features described herein, the predicting includes predicting that the fault will occur based on the difference exceeding the threshold over a number of cycles exceeding a threshold number.

In addition to one or more of the features described herein, the diagnostic signal includes a first voltage response from a first winding of the resolver, and a second voltage response from a second winding of the resolver, the first winding orthogonal to the second winding, and the health indicator is based on a first signal envelope calculated by demodulating the first voltage response, and a second signal envelope calculated by demodulating the second voltage response.

In addition to one or more of the features described herein, the health indicator includes a compensation value acquired based on a wobble compensation algorithm.

In addition to one or more of the features described herein, the health indicator includes at least one of: a normalized modulus of the first signal envelope and the second signal envelope, and a resolver offset value.

In addition to one or more of the features described herein, calculating the reference value includes calculating a nominal value of a moving average of the health indicator during the first time period, and the trend value is a moving average of the health indicator during the second time period.

In yet another exemplary embodiment, a vehicle system includes a memory having computer readable instructions, and a processing device for executing the computer readable instructions, the computer readable instructions controlling the processing device to perform a method. The method includes determining a health indicator from a diagnostic signal acquired from a processing device, the diagnostic signal based on electrical outputs from a resolver connected to an electric motor of a propulsion system, the diagnostic signal related to at least one of a resolver offset and a resolver wobble, calculating a reference value based on values of the health indicator determined during a first time period, and monitoring the health indicator over a second time period, where the monitoring includes continuously or periodically calculating a trend value of the health indicator over a plurality of cycles. The method also includes comparing each trend value to the reference value and estimating a difference between the trend value and the reference value for each cycle, predicting whether a fault will occur based on the difference, and based on the predicting indicating that a fault will occur, outputting a fault indication.

In addition to one or more of the features described herein, the predicting includes comparing the difference to a threshold value, and predicting that the fault will occur based on the difference exceeding the threshold.

In addition to one or more of the features described herein, the predicting includes predicting that the fault will occur based on the difference exceeding the threshold over a number of cycles exceeding a threshold number.

In addition to one or more of the features described herein, the diagnostic signal includes a first voltage response from a first winding of the resolver, and a second voltage response from a second winding of the resolver, the first winding orthogonal to the second winding, and the health indicator is based on a first signal envelope calculated by demodulating the first voltage response, and a second signal envelope calculated by demodulating the second voltage response.

In addition to one or more of the features described herein, the health indicator includes at least one of a compensation value acquired based on a wobble compensation algorithm, and a resolver offset value.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

The following description is merely exemplary in nature and is not intended to limit the present disclosure, its application or uses. It should be understood that throughout the drawings, corresponding reference numerals indicate like or corresponding parts and features.

In accordance with an exemplary embodiment, methods, devices and systems are provided for monitoring a resolver of a propulsion system or systems in a vehicle, and predicting faults in the resolver. An embodiment of a method includes receiving or acquiring measurement signals and/or diagnostic signals (e.g., from a motor controller) and determining one or more health indicators therefrom, such as resolver offsets and compensation values derived from existing diagnostic systems. The method further includes calculating a nominal value indicative of a trend in a health indicator (e.g., moving average) during an initial time period (e.g., a number of trips or measurement cycles). Values of the health indicator are continuously or periodically acquired (e.g., at each of a plurality of cycles) during a second time period, and a moving average or other attribute related to changes and/or a trend in the health indicator is calculated. At each cycle, the attribute is compared to the nominal value to determine a difference or variance, and the variance is compared to a threshold value. If the variance exceeds the threshold value, or exceeds the threshold value for at least a selected number of cycles, a fault prediction is generated and may be output to a user or operator.

Embodiments described herein present numerous advantages and technical effects. The embodiments provide for increased efficiency in vehicle and early detection of potential resolver faults. Existing diagnostic systems are able to detect various outputs and conditions that may represent an error or fault in a resolver, but are not able to effectively predict whether a resolver fault is likely to occur. Embodiments described herein provide a solution to this limitation by providing an effective mechanism to predict resolver faults and provide an alert or indication that allows an operator to address such faults at any early stage before such faults are realized, thereby saving time and resources. In addition, the embodiments can be realized using existing components and utilizing diagnostic signals from existing components and processes.

The embodiments are not limited to use with any specific vehicle and may be applicable to various contexts. For example, embodiments may be used with automobiles, trucks, aircraft, construction equipment, farm equipment, automated factory equipment and/or any other device or system for which additional thermal control may be desired to facilitate a device or system's existing thermal control capabilities or features.

Figure 1:
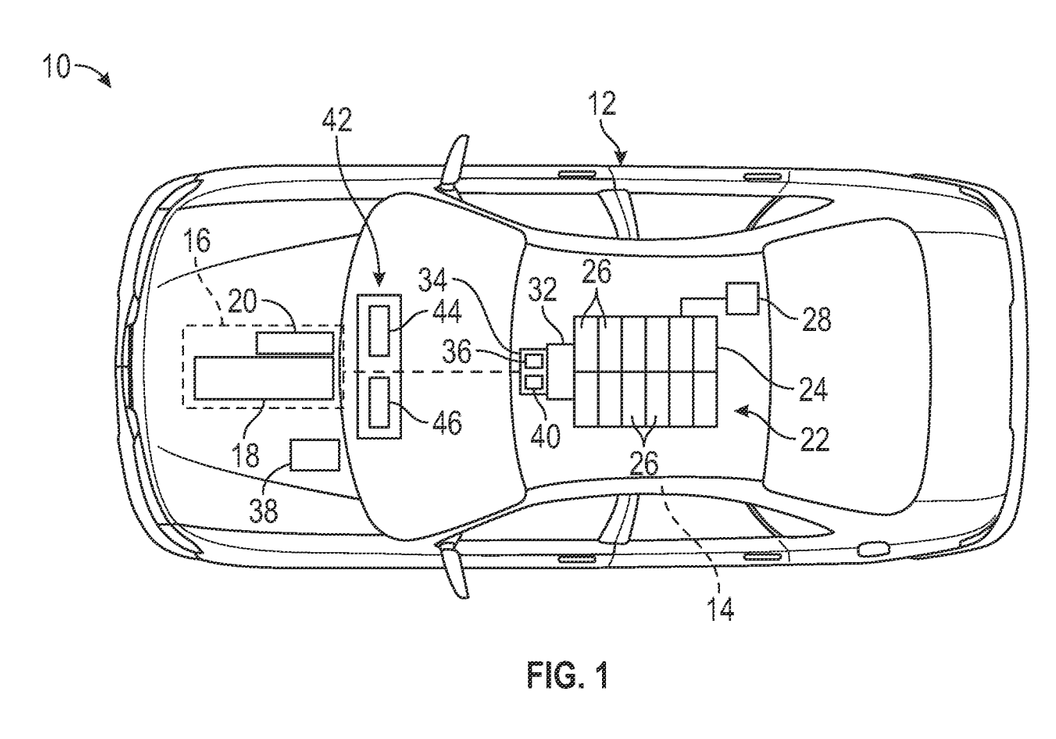
FIG. 1 is a top view of a motor vehicle, in accordance with an exemplary embodiment.

FIG. 1 shows an embodiment of a motor vehicle 10, which includes a vehicle body 12 defining, at least in part, an occupant compartment 14. The vehicle body 12 also supports various vehicle subsystems including a propulsion system 16, and other subsystems to support functions of the propulsion system 16 and other vehicle components, such as a braking subsystem, a suspension system, a steering subsystem, a fuel injection subsystem, an exhaust subsystem and others.

The vehicle 10 may be an electrically powered vehicle (EV) or a hybrid vehicle. In an embodiment, the vehicle 10 is a hybrid vehicle that includes a combustion engine system 18 and at least one electric motor assembly. In an embodiment, the propulsion system 16 includes an electric motor 20, and may include one or more additional motors positioned at various locations.

The vehicle 10 includes a battery system 22, which may be electrically connected to the motor 20 and/or other components, such as vehicle electronics. The battery system 22 may be configured as a rechargeable energy storage system (RESS). In an embodiment, the battery system 22 includes a battery assembly such as a high voltage battery pack 24 having a plurality of battery modules 26. The battery system 22 may also include a monitoring unit 28 that includes components such as a processor, memory, an interface, a bus and/or other suitable components.

The battery system 22 is electrically connected to components of the propulsion system 16. The propulsion system also includes a DC-DC converter module 32 and an inverter module 34. The inverter module 34 (e.g., a traction power inverter unit or TPIM) converts direct current (DC) power from the battery system 22 to poly-phase alternating current (AC) power (e.g., three-phase, six-phase, etc.) to drive the motor 20. In an embodiment, the inverter module 34 includes an inverter 36 connected to the DC-DC-converter module 32 for receiving DC power, and is connected to the motor 20 for providing poly-phase AC power thereto.

The propulsion system 16 includes or is connected to a vehicle controller 38 that provides torque commands to a motor controller 40. The motor controller 40 may be part of the inverter module 34 or may be a separate module or unit.

The vehicle 10 also includes a computer system 42 that includes one or more processing devices 44 and a user interface 46. The various processing devices and units may communicate with one another via a communication device or system, such as a controller area network (CAN) or transmission control protocol (TCP) bus.

Figure 2:
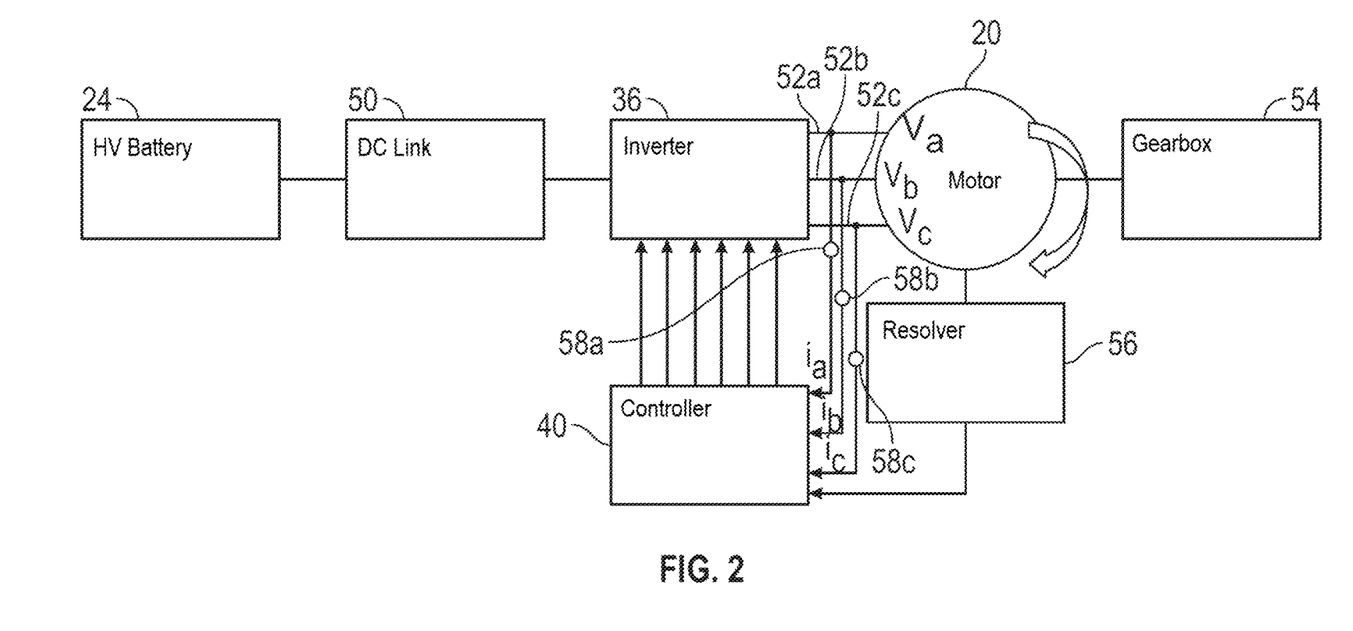
FIG. 2 schematically depicts components of a propulsion system, in accordance with an exemplary embodiment.

FIG. 2 schematically depicts components of the battery system 22 and the propulsion system 16. The inverter 36 is connected to the battery pack 24 by a DC link 50 (e.g., a cable or module terminals). The DC link 50 may include components such as a DC-DC converter for facilitating transfer of power from the battery pack 24 to the inverter 36. The inverter 36 receives a voltage $v_{dc}$, such as 400 V or 800 V.

The motor 20 is an AC motor that receives poly-phase AC power from the inverter 36. For example, the motor 20 is a three-phase motor that receives three-phase power over phase leads 52a, 52b and 52c. The phase lead 52a is connected to a phase A stator winding of the motor 20, the phase lead 52b is connected to a phase B stator winding, and the phase lead 52c is connected to a phase C stator winding. The voltages of the phase A, B and C windings are denoted as $v_a$, $v_b$ and $v_c$, respectively.

The inverter 36 includes a plurality of solid-state switches. As non-limiting examples, the switches may include metal-oxide-semiconductor (MOS)-controlled Thyristors (MCTs), gallium-nitride (GaN) field-effect transistors (FETs), metal-oxide-semiconductor field-effect transistors (MOSFETs), silicon carbide junction field-effect transistors (SiC JFETs), insulated-gate bipolar transistors (IGBTs) or any other suitable device having suitable voltage and current ratings.

The inverter 36 electrically connects to stator phase windings of the motor 20, and controls the switches to generate drive signals in response to torque commands. The drive signals drive the motor 20 to apply torque to driveline components via, for example, a gearbox 54. The motor 20 is not limited to three-phases, and may have any number of phases.

The inverter 36 may employ any suitable pulse width modulation (PWM) control, such as sinusoidal pulse width modulation (SPWM) or space vector pulse width modulation (SVPWM), to generate switching signals to convert stored DC power from the battery pack 24 to AC electric power to drive the motor 20 to generate torque. Control of the inverter 36 may include high frequency switching of the solid-state switches in accordance with the PWM control.

The battery system 22 and/or the propulsion system 16 includes various sensors for monitoring operational parameters and performance. In an embodiment, the propulsion system 16 includes a resolver 56 that is configured to measure the rotational position of the motor 20 and output a rotor position or angle $\theta_r$ to the motor controller 40. The motor controller 40 may also receive parameter measurements such as temperature, voltage and current. For example, a current sensor 58a measures current $i_a$ through the phase A lead 52a, a current sensor 58b measures current $i_b$ through the phase B lead 52b, and a current sensor 58c measures current $i_c$ through the phase C lead 52c.

Figure 3:
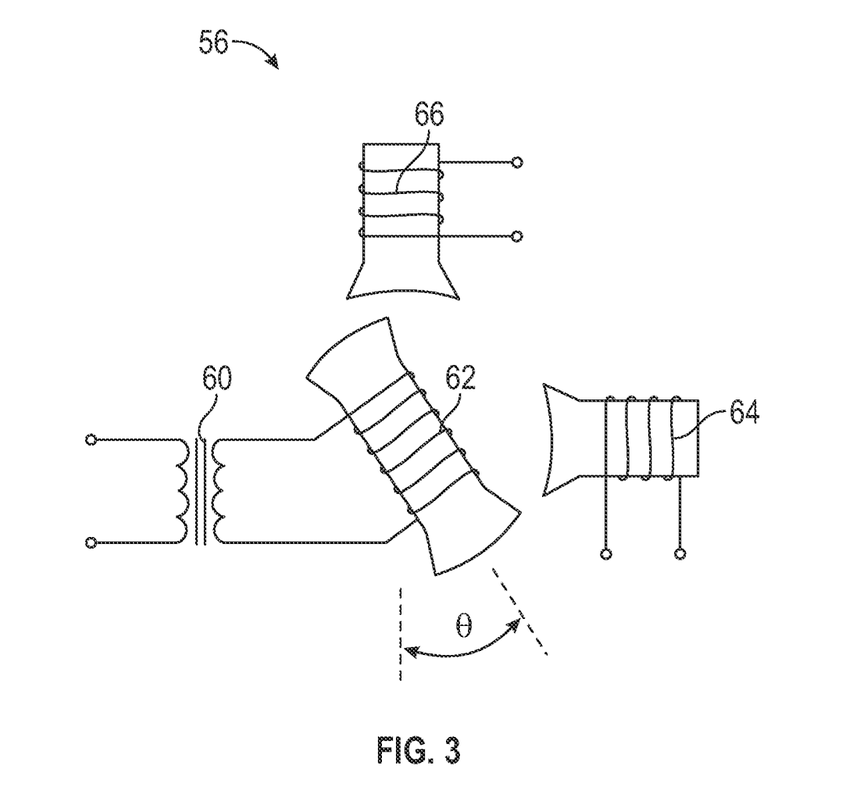
FIG. 3 depicts components of an example of a resolver.
Figure 4:
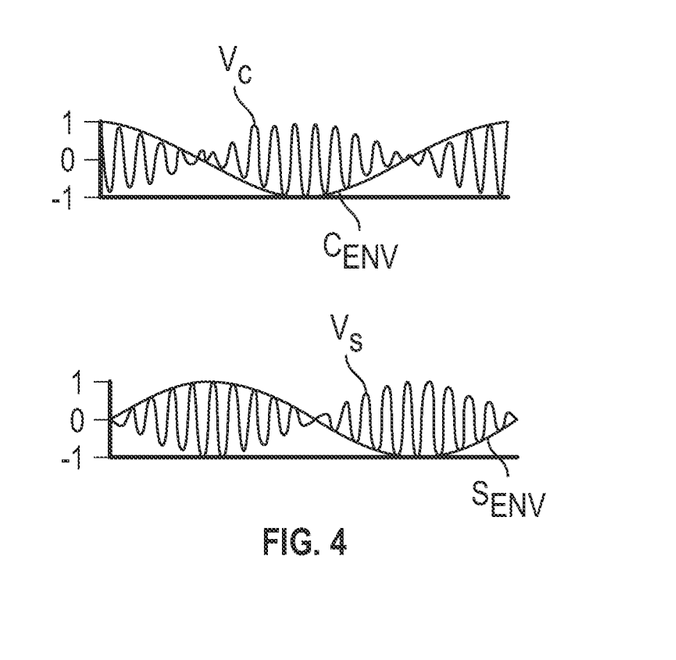
FIG. 4 depicts an example of measurement and diagnostic signals associated with the resolver of FIG. 3.

FIG. 3 illustrates components of the resolver 56, and FIG. 4 depicts examples of voltage signals generated by the resolver 56. The resolver 56 is a rotary transformer device that includes a rotary transformer 60 connected to an excitation winding 62 (primary winding). The resolver 56 also has secondary windings including a first winding 64 (sine winding) and a second winding 66 (cosine winding) orthogonal to the first winding 64. It is noted that the resolver 56 is not limited to this example, and may be any suitable type of resolver (e.g., axial flux resolver, variable reluctance resolver, etc.)

The resolver 56 receives an excitation signal $V_E$ that excites the primary excitation winding 62, which in turn induces a voltage response in the secondary windings 64 and 66. The voltage response of the first winding 64 is denoted $V_s$, and the voltage response of the second winding 66 is denoted $V_c$. The excitation signal and voltage responses may be represented by:

$V_E = V_e \cos(\omega_e t)$, where $V_e$ is the voltage amplitude, $\omega_e$ is angular frequency, and t is time;

$V_s = V_e \cos(\omega_e t) \sin(\theta_r)$, where $\theta_r$ is the rotational position of the motor 20; and $V_c = V_{Be} \cos(\omega_e t) \cos(\theta_r)$.

Embodiments utilize resolver measurements and diagnostic signals to generate a prediction that indicates whether a fault is likely to occur. The prediction provides an early detection of one or more resolver faults (i.e., prior to a resolver fault being fully realized) based on analysis of trends of the signals. Such resolver faults can occur due to conditions such as mechanical errors (e.g., resolver offsets) and wobble (e.g., amplitude imbalance, orthogonality error, and offset/eccentricity errors).

In an embodiment, prediction is based on health indicators that correspond to, or are derived from, diagnostic and/or measurement signals acquired from the motor controller 40 or other processor. In an embodiment, the diagnostic signals are acquired from pre-existing diagnostic components and/or algorithms. For example, the diagnostic signals are from a wobble compensation algorithm and/or diagnostics. The diagnostic signals may be related to analysis of the voltage responses, such as signal envelopes derived from the voltage responses.

FIG. 3 depicts an example of a voltage response $V_s$ of the winding 64 and a voltage response $V_c$ of the winding 66. The voltage responses are represented by curves of a normalized signal magnitude M as a function of time t. $V_s$ is an oscillating signal, which can be demodulated to derive a signal envelope $S_{ENV}$. $V_c$ is also an oscillating signal that can be demodulated to derive a signal envelope $C_{ENV}$. The signal envelope $S_{ENV}$ can be represented by:

$V_{c,demod} = V_e \cos(\theta_r)$, and the signal envelope $C_{ENV}$ can be represented by:

$V_{s,demod} = V_e \sin(\theta_r)$. The voltage response curves and signal envelopes may be considered as measurement signals.

$S_{ENV}$ and $C_{ENV}$ may be used as inputs to a compensation algorithm that compensates for errors due to resolver wobble and/or resolver offset. Outputs from the compensation algorithm and/or compensation parameters used by the algorithm may be calculated and used as health indicators. The health indicators are analyzed as described herein, to determine trends in values of the health indicators and make predictions as to whether a fault will occur.

Resolver offset can be determined based on an offset of the envelopes from a center point or zero point (i.e., $S_{ENV}$ and $C_{ENV}$ are not exactly centered about zero). Wobble can manifest in multiple ways, including resolver offset.

For example, wobble may be due to an amplitude imbalance ($S_{ENV}$ and $C_{ENV}$ do not have the sample signal amplitude), orthogonality or phase error ($S_{ENV}$ and $C_{ENV}$ are not exactly separated by 90 degrees), and mounting eccentricity or misalignment (i.e., misalignment of the physical resolver stator and/or rotor with respect to the motor shaft).

Compensation may be based on deriving a compensated cosine envelope $C_{ENV,COMP}$ using an integral controller to correct the signal amplitudes and/or phases. The compensation algorithm calculates a correction value or compensation value that is applied to a measurement signal $V_c$ or $v_s$ (e.g., the measurement signal is multiplied by the compensation value to drive to measurement signal to a desired set-point). For example, the compensation algorithm derives a cosine envelope amplitude compensation parameter $M_{amp,c}$, that can be applied to the cosine signal and an orthogonality compensation parameter $M_{ortho}$ that can be applied to the sine signal.

The compensation algorithm considers $C_{ENV}$ and $S_{ENV}$ as non-ideal demodulated envelopes, represented as follows:

$S_{ENV}=A_1 \sin(\theta)$, where $A_1$ is amplitude and $\theta$ is rotational position angle; and $C_{ENV}=A_2 \cos(\theta-\varphi)$, where $A_2$ is amplitude and $\varphi$ is phase shift.

The compensation algorithm calculates $M_{amp,c}$, and $M_{ortho}$ based on:

$C_{ENV,COMP}=A_1 \cos(\theta)=M_{amp,c}C_{ENV}-M_{ortho}S_{ENV}$, which is satisfied when the following conditions converge:

$(M_{amp,c}A_2)^2=A_1^2+(M_{ortho}A_1)^2$, and $$\tan(\varphi) = \frac{M_{ortho}A_1}{A_1}.$$

In addition to wobble compensation, other resolver diagnostics are available. The diagnostics are based on normalizing the envelopes. One such diagnostic is a "modulus norm," which based on the modulus of the sine and cosine curves $V_s$ and $V_c$ that are normalized by a calibration to be close to unity. The modulus norm can be represented as:

$$\text{Modulus\_Norm} = \frac{\sqrt{(S_{ENV}^2 + C_{ENV}^2)}}{\text{Envelope\_Amp}(S, C)},$$

where Envelope Amplitude(S, C) is a fixed envelope magnitude selected, for example, based on a design of the resolver 56.

Another diagnostic signal is referred to as a "wobble-adaptive modulus norm," which is based on the modulus of the sin and cosine envelopes $S_{EV}$ and $C_{EV}$ (e.g., calculated during wobble compensation), which have been normalized to one by a first order filter (e.g., a slow first order filter that acts as a rolling average filter). The compensated sine envelope is denoted as $S_{ENV,COMP}$, and the compensated cosine envelope is donated as $C_{ENV,COMP}$. The wobble-adaptive modulus norm can be represented as:

$$\text{Wobble\_Adaptive\_Modulus\_Norm} = \frac{\sqrt{(S_{ENV,COMP}^2 + C_{ENV,COMP}^2)}}{avg\sqrt{(S_{ENV,COMP}^2 + C_{ENV,COMP}^2)}}.$$

The above diagnostic signals are typically used to detect two types of faults. A loss of signal (LOS) fault is triggered by the modulus norm falling below a calibratable threshold. A degradation of signal (DOS) fault is triggered by the modulus norm being greater than a calibratable threshold (close to the ADC max input), and the wobble-adaptive modulus norm having AC content being outside of a calibratable high and low threshold.

Figure 5A:
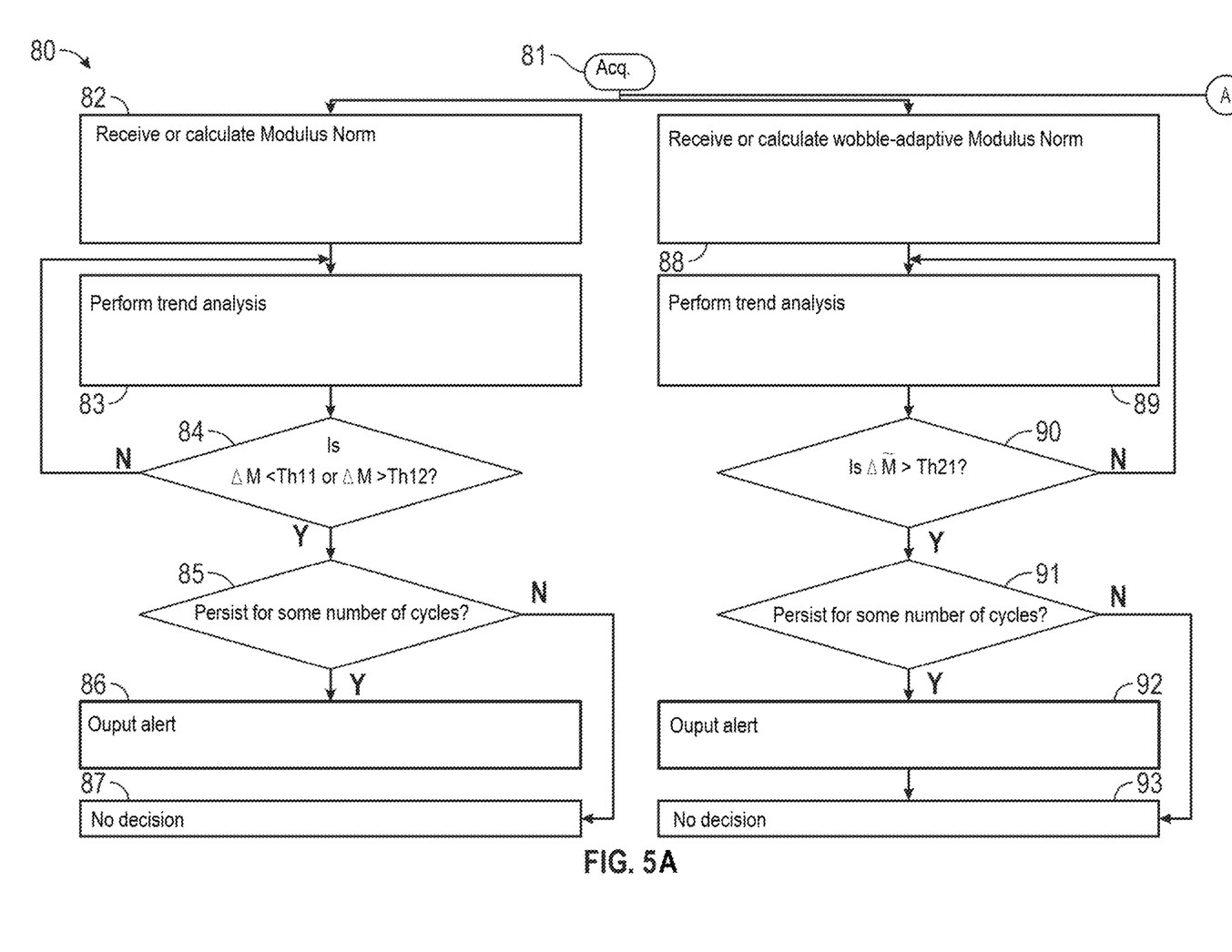
FIGS. 5A and 5B are a flow diagram depicting aspects of a method of monitoring components of a propulsion system, in accordance with an exemplary embodiment.
Figure 5B:
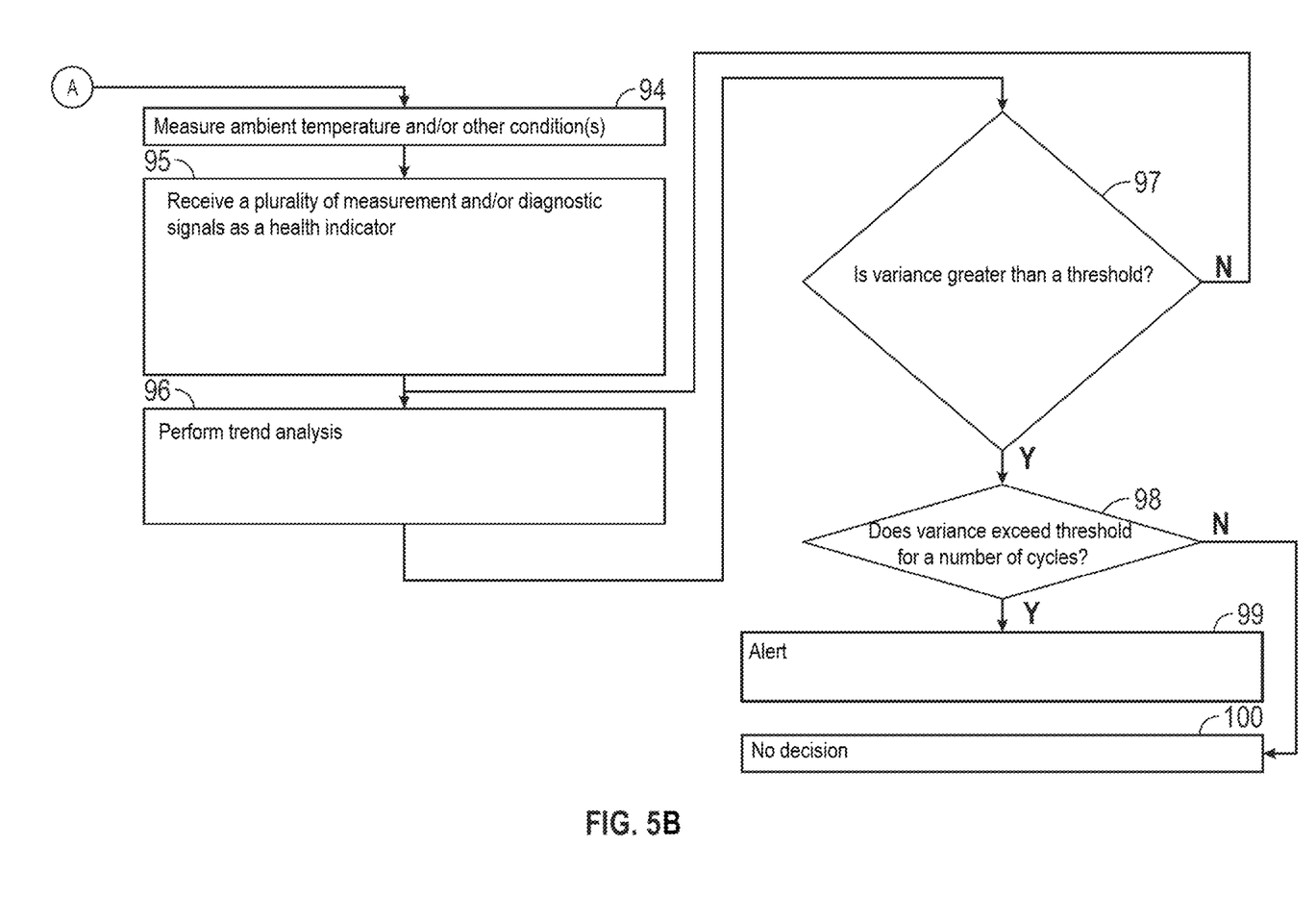

FIGS. 5A and 5B depict an embodiment of a method 80 of monitoring and/or controlling operation of a vehicle propulsion system. The method 80 may be performed in conjunction with the vehicle 10 and the propulsion system 16. However, the method 80 is not so limited and may be used with any suitable electric motor system that utilizes a resolver. Aspects of the method 80 may be performed by a suitable processing device or combination of processing devices.

The method 80 includes a number of steps or stages represented by blocks 81-100. The method 80 is not limited to the number or order of steps therein, as some steps represented by blocks 81-100 may be performed in a different order than that described below, or fewer than all of the steps may be performed.

In an embodiment, the method 80 includes a process for each of a plurality of different health indicators. The processes may be performed or executed in parallel. For example, steps at blocks 82-87 (related to predictions based on the modulus norm) may be performed in parallel with steps at blocks 88-93 and/or in parallel with steps 94-100.

At block 81, a processing device, such as the motor controller 40 (or other controller such as the vehicle controller 38) acquires one or more measurement and/or diagnostic signals. The processing device may receive measurement signals, such as oscillating signals from the stator windings, and calculate diagnostic signals such as sine and cosine envelopes (e.g., $S_{EV}$ and $C_{EV}$), and compensation values (e.g., compensation parameter $M_{amp,c}$ and/or the compensation parameter $M_{ortho}$).

Alternatively, the diagnostic signals may be calculated by another processor (e.g., a diagnostic/monitoring unit) and transmitted to the processing device. The diagnostic signals are used to determine one or more health indicators. It is noted that the method 80 is not limited to the specific signals discussed herein, and may be any suitable signal that allows for resolver performance evaluation.

At block 82, the processing device receives or calculates the modulus norm (e.g., based on the Modulus_Norm equation) as a health indicator. The processing device then estimates or acquires a reference value. The reference value is a nominal value $M_{nom}$ of the moving average of the modulus norm over a first time period during normal (non-faulty) operation of a resolver (e.g., the resolver 56). For example, the moving average is calculated for each of a number N1 of initial trips made by the vehicle 10 or measurement cycles ($M_{nom}=(\Sigma_{i=1}^{N1}M_i)/N1$), where i is a trip number or index). The moving average is considered a reference value.

At block 83, a trend analysis is performed continuously or periodically (e.g., at each measurement cycle) by measuring diagnostic signals and calculating a moving average $M_{MA}$ of the modulus norm over a second time period (e.g. a number N1 of subsequent trips or measurement cycles). For example, $M_{MA}=(\Sigma_{k=0}^{N1-1}M_{k-i})/N1$, where k is a trip index. The moving average $M_{MA}$ is compared to the reference value $M_{nom}$, and a difference or variance therebetween is calculated. In an embodiment, a variance $\Delta M$ is calculated as a difference between $M_{nom}$ and $M_{MA}$ (i.e., $\Delta M = M_{nom} - M_{MA}$).

At block 84, the variance ΔM is compared to one or more threshold values or a value range. For example, the variance ΔM is compared to a first lower threshold value Th11 and a first upper threshold value Th12. If ΔM is within the thresholds (i.e., ΔM<Th11 or ΔM>Th12), the method 80 returns to block 83 and continues to monitor the moving average.

At block 85, if ΔM is outside of the thresholds (i.e., ΔM≥Th11 or ΔM≤Th12), the processing device determines whether ΔM is outside of the thresholds (is in an error condition) for a given period of time. For example, the processing device determines whether the error condition for ΔM persists for a selected number of cycles (denoted X1 cycles), where each cycle represents an iteration of blocks 82-84.

It is noted that the thresholds described herein may be selected in order to control the prediction horizon (i.e., how far in the future is the prediction valid) and/or severity of the predicted fault. The horizon and/or severity may be determined using historical data (e.g., previous data collected from the vehicle and/or fleet data).

At block 86, if the error condition for ΔM persists for greater than X1 cycles, the processing device outputs an indication such as an alert (e.g., via the computer system 42) to the user and/or to another location (e.g., a server, fleet monitoring system, etc.). The processing device may perform other actions, such as performing or requesting additional diagnostic processes, controlling vehicle operation, and others. If the error condition does not persist for at least X1 cycles (block 87), no decision can be made and the processing device continues to monitor as discussed at blocks 82-85.

At block 88, the processing device receives or calculates a wobble-adaptive modulus norm $M_{adap}$ as a health indicator based on the equation for Wobble_Adaptive_Modulus_Norm. A reference value is calculated as a nominal value of a moving average $\tilde{M}_{adap,nom}$ of the wobble-adaptive modulus norm, or other attribute indicative of a trend, over a first time period during normal (non-faulty) operation of a resolver (e.g., the resolver 56). For example, the moving average is calculated for each of a number N2 of initial trips or measurement cycles made by the vehicle ($\tilde{M}_{adap,nom} = \Sigma_{i=1}^{N1}(M_{adap,i} - \overline{M}_{adap})/N2-1$, where i is a trip number or index).

At block 89, trend analysis is performed continuously or periodically over a second time period (e.g., a subsequent number N2 of trips or measurements cycles). During the second time period, a moving average $M_{adap,MV}$ of $M_{adap}$ ($M_{adap,MV} = \Sigma_{i=1}^{N1}(M_{adap,k-i} - \overline{M}_{adap})/(N2-1\Delta)$, where k is a trip index) is calculated at each trip or measurement cycle. In an embodiment, the moving average $M_{adapt,MV}$ is compared to the reference value ($\tilde{M}_{adap,nom}$), and a variance $\Delta\tilde{M}$ is calculated ($\Delta\tilde{M} = M_{adap,MV} - \tilde{M}_{adap,nom}$).

At block 90, the variance $\Delta\tilde{M}$ is compared to one or more threshold values or a value range. For example, the variance $\Delta\tilde{M}$ is compared to a threshold Th21. If $\Delta\tilde{M}$ is less than or equal to the threshold, the method 80 returns to block 89 continues to monitor the moving average.

At block 91, if $\Delta\tilde{M}$ is greater than the threshold (i.e., $\Delta\tilde{M}$>Th21), the processing device determines whether $\Delta\tilde{M}$ is greater than the threshold (is in an error condition) for a given period of time. For example, the processing device determines whether the error condition persists for a selected number of cycles (denoted X2 cycles), where each cycle represents an iteration of blocks 88-90.

At block 92, if the error condition persists for greater than X2 cycles, the processing device outputs an indication such as an alert (e.g., via the computer system 42) to the user and/or to another location (e.g., a server, fleet monitoring system, etc.). The processing device may perform other actions as discussed above. If the error condition does not persist for at least X2 cycles (block 93), no decision can be made and the processing device continues to monitor as discussed at blocks 88-91.

At block 94, the processing device measures the ambient temperature (and/or other conditions relevant to the resolver 56, such as torque). The temperature may be used to determine thresholds for trend analysis of various measurements and/or diagnostic signals.

At block 95, the processing device receives any of a plurality of different measurement and/or diagnostic signals as a health indicator (denoted $M_x$). For example, the health indicator is selected or calculated as $M_{amp,s}$ (a compensation value applicable to a sine signal), $M_{amp,c}$, $M_{ortho}$, $M_{offset,s}$ (sine signal offset), or $M_{offset,c}$ (cosine signal offset). Although only a single health indicator $M_x$ is discussed, it is to be understood that the method 80 may include generating a prediction for multiple health indicators in parallel.

A reference value is calculated by calculating a nominal value of a moving average (or other attribute indicative of a trend) of $M_x$ over a first time period (e.g., for each of a number N3 of trips or measurement cycles). The moving average is denoted as $M_{x,nom}$, where $M_{x,nom} = (\Sigma_{i=1}^{N1} M_{x,i})/N3$, and i is a trip index.

At block 96, the health indicator $M_x$ is monitored or calculated over a second time period, and trend analysis is performed by calculating a moving average $M_{x,MA}$ or other attribute. A variance $\Delta M_x$ is calculated by estimating a difference between the nominal value and $M_{x,MA}$ at each measurement cycle or trip ($\Delta M_x = M_{x,MA} - M_{x,nom}$).

At block 97, as the variance $\Delta M_x$ is calculated, it is compared to a selected threshold. The following are examples of thresholds for the variance of each of the above-mentioned diagnostic signals:

$|\Delta M_{amp,s}| > Th31;$ $|\Delta M_{amp,c}| > Th32;$ $|\Delta M_{ortho}| > Th33;$ $|M_{offset,s}| > Th34;$ and $|M_{offset,c}| > Th35.$ At block 98, if the variance $\Delta M_x$ exceeds a corresponding threshold (i.e., is in an error condition), the processing device determines whether the variance $\Delta M_x$ exceeds the threshold for a given period of time, e.g., for a selected number of cycles (denoted X3 cycles), where each cycle represents an iteration of blocks 94-97.

At block 99, if the error condition for $\Delta M_x$ persists for greater than X3 cycles, the processing device outputs an indication such as an alert (e.g., via the computer system 42) to the user and/or to another location (e.g., a server, fleet monitoring system, etc.). The processing device may perform other actions as discussed above. If the error condition does not persist for at least X3 cycles (block 100), no decision can be made and the processing device continues to monitor as discussed at blocks 94-98.

Figure 6:
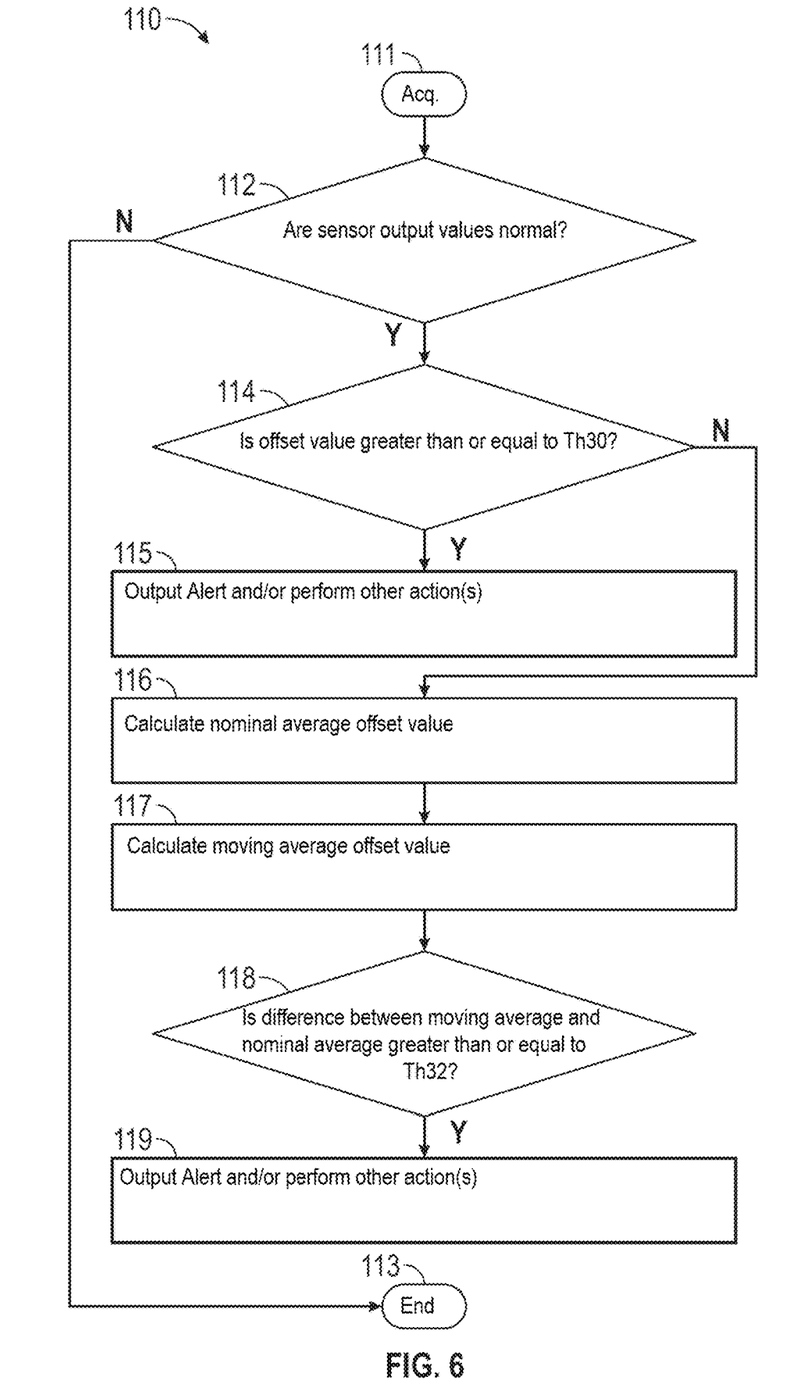
FIG. 6 is a flow diagram depicting aspects of a method of monitoring components of a propulsion system, in accordance with an exemplary embodiment.

FIG. 6 depicts an embodiment of a method 110 of monitoring and/or controlling operation of a vehicle propulsion system. The method 110 may be performed in conjunction with the vehicle 10 and the propulsion system 16. However, the method 110 is not so limited and may be used with any suitable electric motor drive system. Aspects of the method 110 may be performed by a suitable processing device or combination of processing devices.

The method 110 includes a number of steps or stages represented by blocks 111-119. The method 110 is not limited to the number or order of steps therein, as some steps represented by blocks 111-119 may be performed in a different order than that described below, or fewer than all of the steps may be performed.

At block 111, the processing device acquires measurement signals from measurements of the resolver 56, such as measurements of current supplied to the resolver 56. For example, current sensor outputs from sensors 58a, 58b and 58c are acquired.

At block 112, the current sensor output values are analyzed to determine whether the output values are within ranges associated with normal (non-faulty) operation. If the output values are abnormal, the method ends at block 113.

At block 114, if the output values are normal, a resolver offset value is acquired (e.g., from existing diagnostics) and compared to a selected threshold Th30. At block 115, if the offset value is greater than or equal than the threshold Th30, the processing device outputs an alert and/or performs other actions.

At block 116, the processing device calculates and stored a nominal average offset value over a first time period (e.g., over N31 cycles). At block 117, a moving average of the offset is calculated during the same time period.

At block 118, a difference between the moving average and the nominal average is calculated and compared to a difference threshold Th32. The processing device determines whether the difference is greater than or equal to the threshold Th32. At block 119, if the difference is greater than or equal to the threshold, the processing device outputs an alert and/or performs other actions as discussed herein.

Figure 7:
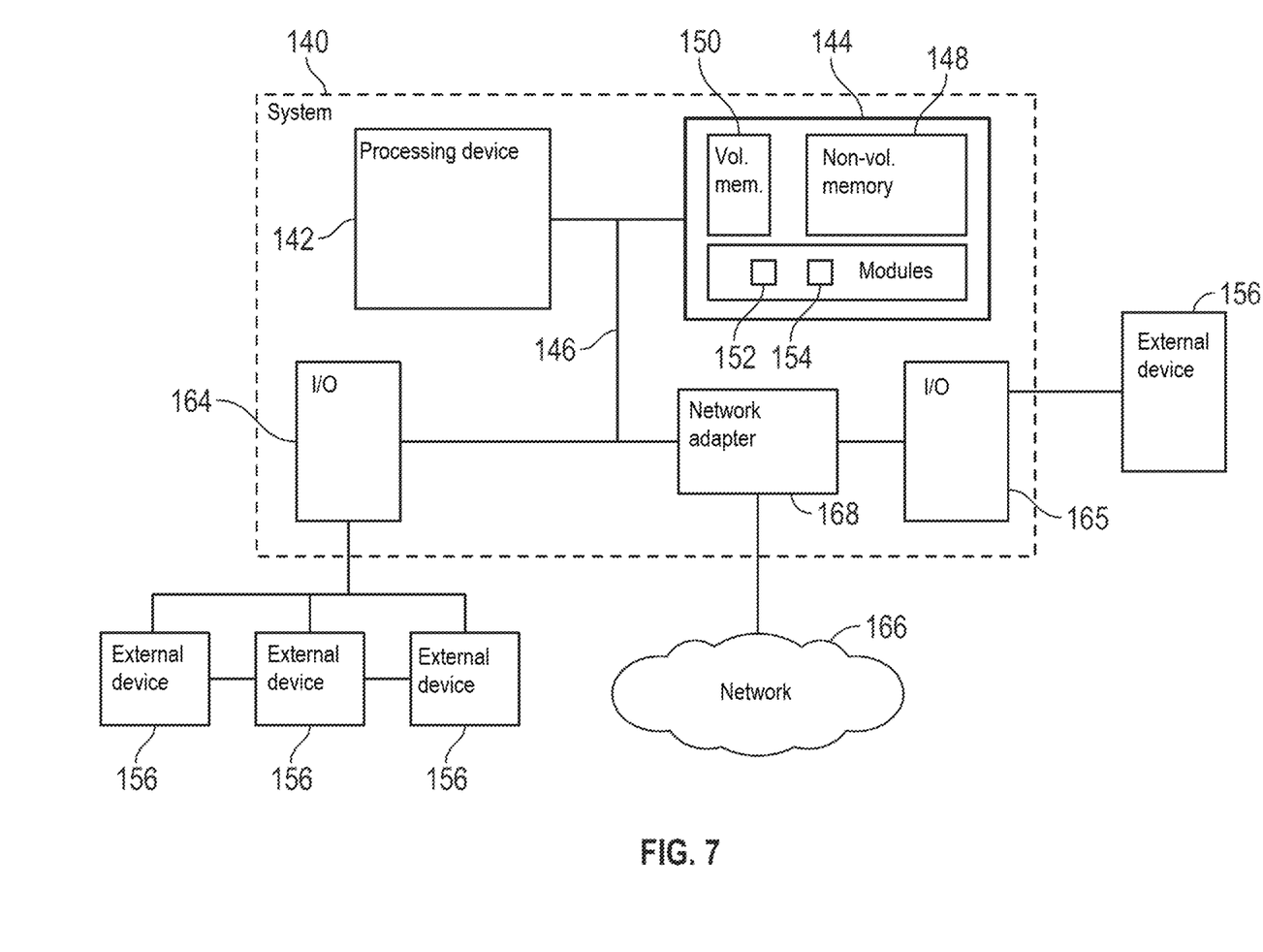
FIG. 7 depicts a computer system in accordance with an exemplary embodiment.

FIG. 7 illustrates aspects of an embodiment of a computer system 140 that can perform various aspects of embodiments described herein. The computer system 140 includes at least one processing device 142, which generally includes one or more processors for performing aspects of image acquisition and analysis methods described herein.

Components of the computer system 140 include the processing device 142 (such as one or more processors or processing units), a memory 144, and a bus 146 that couples various system components including the system memory 144 to the processing device 142. The system memory 144 can be a non-transitory computer-readable medium, and may include a variety of computer system readable media. Such media can be any available media that is accessible by the processing device 142, and includes both volatile and non-volatile media, and removable and non-removable media.

For example, the system memory 144 includes a non-volatile memory 148 such as a hard drive, and may also include a volatile memory 150, such as random access memory (RAM) and/or cache memory. The computer system 140 can further include other removable/non-removable, volatile/non-volatile computer system storage media.

The system memory 144 can include at least one program product having a set (e.g., at least one) of program modules that are configured to carry out functions of the embodiments described herein. For example, the system memory 144 stores various program modules that generally carry out the functions and/or methodologies of embodiments described herein. A module 152 may be included for performing functions related to monitoring a drive system or propulsion system, and a module 154 may be included to perform functions related to fault prediction as discussed herein. The system 140 is not so limited, as other modules may be included. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

The processing device 142 can also communicate with one or more external devices 156 as a keyboard, a pointing device, and/or any devices (e.g., network card, modem, etc.) that enable the processing device 142 to communicate with one or more other computing devices. Communication with various devices can occur via Input/Output (I/O) interfaces 164 and 165.

The processing device 142 may also communicate with one or more networks 166 such as a local area network (LAN), a general wide area network (WAN), a bus network and/or a public network (e.g., the Internet) via a network adapter 168. It should be understood that although not shown, other hardware and/or software components may be used in conjunction with the computer system 40. Examples include, but are not limited to: microcode, device drivers, redundant processing units, external disk drive arrays, RAID systems, and data archival storage systems, etc.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this disclosure belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof

What is claimed is:

1. A method of monitoring a propulsion system of a vehicle, the method comprising:
   determining a health indicator from a diagnostic signal acquired from a processing device, the diagnostic signal based on electrical outputs from a resolver connected to an electric motor of the propulsion system, the diagnostic signal related to at least one of a resolver offset and a resolver wobble;

calculating a reference value based on values of the health indicator determined during a first time period;

monitoring the health indicator over a second time period, wherein the monitoring includes continuously or periodically calculating a trend value of the health indicator over a plurality of cycles;

comparing each trend value to the reference value and estimating a difference between the trend value and the reference value for each cycle, and predicting whether a fault will occur based on the difference;

based on the predicting indicating that a fault will occur, outputting a fault indication; and controlling operation of the vehicle based on the fault indication.

2. The method of claim 1, wherein the predicting includes comparing the difference to a threshold value, and predicting that the fault will occur based on the difference exceeding the threshold.

3. The method of claim 2, wherein the predicting includes predicting that the fault will occur based on the difference exceeding the threshold over a number of cycles exceeding a threshold number.

4. The method of claim 1, wherein the diagnostic signal includes a first voltage response from a first winding of the resolver, and a second voltage response from a second winding of the resolver, the first winding orthogonal to the second winding, and the health indicator is based on a first signal envelope calculated by demodulating the first voltage response, and a second signal envelope calculated by demodulating the second voltage response.

5. The method of claim 4, wherein the health indicator includes a compensation value acquired based on a wobble compensation algorithm.

6. The method of claim 4, wherein the health indicator includes a normalized modulus of the first signal envelope and the second signal envelope.

7. The method of claim 4, wherein the health indicator includes a resolver offset value.

8. The method of claim 1, wherein calculating the reference value includes calculating a nominal value of a moving average of the health indicator during the first time period, and the trend value is a moving average of the health indicator during the second time period.

9. A device for monitoring a propulsion system of a vehicle, the device comprising:

a processing device connected to a resolver configured to measure a position of an electric motor of the propulsion system, the processing device configured to:

determine a health indicator from a diagnostic signal, the diagnostic signal based on electrical outputs from the resolver and related to at least one of a resolver offset and a resolver wobble;

calculate a reference value based on values of the health indicator determined during a first time period;

monitor the health indicator over a second time period, wherein the monitoring includes continuously or periodically calculating a trend value of the health indicator over a plurality of cycles;

compare each trend value to the reference value and estimate a difference between the trend value and the reference value for each cycle, and predict whether a fault will occur based on the difference;

based on the predicting indicating that a fault will occur, output a fault indication; and control operation of the vehicle based on the fault indication.

10. The device of claim 9, wherein the predicting includes comparing the difference to a threshold value, and predicting that the fault will occur based on the difference exceeding the threshold.

11. The device of claim 10, wherein the predicting includes predicting that the fault will occur based on the difference exceeding the threshold over a number of cycles exceeding a threshold number.

12. The device of claim 9, wherein the diagnostic signal includes a first voltage response from a first winding of the resolver, and a second voltage response from a second winding of the resolver, the first winding orthogonal to the second winding, and the health indicator is based on a first signal envelope calculated by demodulating the first voltage response, and a second signal envelope calculated by demodulating the second voltage response.

13. The device of claim 12, wherein the health indicator includes a compensation value acquired based on a wobble compensation algorithm.

14. The device of claim 12, wherein the health indicator includes at least one of: a normalized modulus of the first signal envelope and the second signal envelope, and a resolver offset value.

15. The device of claim 9, wherein calculating the reference value includes calculating a nominal value of a moving average of the health indicator during the first time period, and the trend value is a moving average of the health indicator during the second time period.

16. A vehicle system comprising:

a memory having computer readable instructions; and a processing device for executing the computer readable instructions, the computer readable instructions controlling the processing device to perform a method including:

determining a health indicator from a diagnostic signal acquired from a processing device, the diagnostic signal based on electrical outputs from a resolver connected to an electric motor of a propulsion system, the diagnostic signal related to at least one of a resolver offset and a resolver wobble;

calculating a reference value based on values of the health indicator determined during a first time period;

monitoring the health indicator over a second time period, wherein the monitoring includes continuously or periodically calculating a trend value of the health indicator over a plurality of cycles;

comparing each trend value to the reference value and estimating a difference between the trend value and the reference value for each cycle, and predicting whether a fault will occur based on the difference;

based on the predicting indicating that a fault will occur, outputting a fault indication; and controlling operation of the vehicle based on the fault indication.

17. The vehicle system of claim 16, wherein the predicting includes comparing the difference to a threshold value, and predicting that the fault will occur based on the difference exceeding the threshold.

18. The vehicle system of claim 17, wherein the predicting includes predicting that the fault will occur based on the difference exceeding the threshold over a number of cycles exceeding a threshold number.

19. The vehicle system of claim 16, wherein the diagnostic signal includes a first voltage response from a first winding of the resolver, and a second voltage response from a second winding of the resolver, the first winding orthogonal to the second winding, and the health indicator is based on a first signal envelope calculated by demodulating the first voltage response, and a second signal envelope calculated by demodulating the second voltage response.

20. The vehicle system of claim 19, wherein the health indicator includes at least one of: a compensation value acquired based on a wobble compensation algorithm, and a resolver offset value.

\* \* \* \* \*